(12) United States Patent
Pozdal et al.

(10) Patent No.: US 11,920,869 B2
(45) Date of Patent: Mar. 5, 2024

(54) BALANCED HEAT TRANSFER MECHANISM AND CONTROL FOR AUTOMOTIVE VEHICLES COMMUNICATION SYSTEMS

(71) Applicant: Continental Automotive Systems, Inc., Auburn Hills, MI (US)

(72) Inventors: Robert Pozdal, Inverness, IL (US); Tony Asghari, Glenview, IL (US); Casey Szewc, Schaumburg, IL (US); Israel Cruz, Zapopan (MX); Thomas Brey, Lake In The Hills, IL (US); James Snider, Kildeer, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 255 days.

(21) Appl. No.: 17/179,045

(22) Filed: Feb. 18, 2021

(65) Prior Publication Data

US 2021/0254900 A1    Aug. 19, 2021

Related U.S. Application Data

(60) Provisional application No. 62/978,502, filed on Feb. 19, 2020.

(51) Int. Cl.
  *H01L 23/427*    (2006.01)
  *F28D 15/02*     (2006.01)
  *H05K 7/20*      (2006.01)

(52) U.S. Cl.
  CPC ........ *F28D 15/0275* (2013.01); *H01L 23/427* (2013.01)

(58) Field of Classification Search
  CPC .......................... F28D 15/0275; H01L 23/427
  (Continued)

(56) References Cited

U.S. PATENT DOCUMENTS 5,777,846 A    7/1998  Hayes et al.
5,793,611 A    8/1998  Nakazato et al.
(Continued)

FOREIGN PATENT DOCUMENTS

CN    107464795 A    12/2017
CN    109922599 A    6/2019
JP    2014192346 A   10/2014

OTHER PUBLICATIONS

Ram Ranjan et al. "Thermoelectric Package Design for High Ambient Temperature Electronics Cooling", 15th IEEE ITHERM Conference, 2016, United Technologies Research Center, East Hartford, CT, USA.

(Continued)

*Primary Examiner* — Anatoly Vortman

(57) ABSTRACT

An energy-moving device (EMD) transfers heat between a low-temperature-rated device (LTRD) and a high-temperature-rated device (HTRD), wherein the LTRD is thermally separated from the HTRD such that the LTRD is not stacked above the HTRD. A temperature-controlling device (TCD) actively transfers heat between the LTRD and the EMD. An air-moving device (AMD) generates an air stream for transferring heat from the EMD to ambient air. A controller receives temperature information about the ambient air, the LTRD, and the HTRD; determines when heat should be removed from the LTRD, when heat should be added to the LTRD, and when no heat needs to be transferred to or from the LTRD; and determines a first voltage for the TCD and a second voltage for the AMD based on the received temperature information. And a neural network updates the voltage values based on how effectively the voltage values have performed.

12 Claims, 8 Drawing Sheets

(58) Field of Classification Search
USPC .......................................................... 361/514
See application file for complete search history.

(56) References Cited

U.S. PATENT DOCUMENTS

| | | | | |
|---|---|---|---|---|
| 6,191,546 | B1* | 2/2001 | Bausch | H05K 7/20209 388/934 |
| 7,110,258 | B2 | 9/2006 | Ding et al. | |
| 8,333,235 | B2* | 12/2012 | Chang | F28D 15/043 165/104.26 |
| 9,606,586 | B2* | 3/2017 | Rubenstein | H01L 23/427 |
| 11,409,340 | B2* | 8/2022 | Shen | G06F 1/1632 |
| 2003/0128515 | A1* | 7/2003 | Faneuf | H05K 7/20809 165/104.33 |
| 2004/0037045 | A1* | 2/2004 | Phillips | F28D 15/0233 361/719 |
| 2004/0080907 | A1* | 4/2004 | Belady | H05K 7/20772 165/104.33 |
| 2005/0091989 | A1 | 5/2005 | Leija et al. | |
| 2008/0024992 | A1 | 1/2008 | Pflueger | |
| 2008/0092554 | A1* | 4/2008 | Okamoto | F25B 21/02 62/3.7 |
| 2009/0282852 | A1 | 11/2009 | Venkatasubramanian et al. | |
| 2016/0161155 | A1* | 6/2016 | Guichard | F25D 16/00 62/324.2 |
| 2018/0308783 | A1* | 10/2018 | Refai-Ahmed | H01L 23/373 |
| 2018/0348831 | A1 | 12/2018 | de Bock et al. | |
| 2019/0252745 | A1 | 8/2019 | Piggott et al. | |
| 2021/0059073 | A1* | 2/2021 | Patankar | H05K 7/20336 |
| 2021/0216119 | A1* | 7/2021 | Kuo | H05K 7/20172 |
| 2021/0254900 | A1* | 8/2021 | Pozdal | H05K 7/20209 |

OTHER PUBLICATIONS

International Search Report and Written Opinion dated May 6, 2021 from corresponding International Application No. PCT/US2021/018518.

Hiraoki Gomi et al. "Neural Network Control for a Closed-Loop System Using Feedback-Error-Learning", Neural Networks, vol. 6, pp. 933-946, Pergamon Press Ltd., Jan. 1993.

M.Y. Rafiq et al. "Neural network design for engineering applications", Computers and Structures 79 (2001) 1541-1552, Elsevier, Apr. 2001.

Jose R. Noriega et al. "A Direct Adaptive Neural-Network Control for Unknown Nonlinear Systems and Its Applications", IEEE Transactions On Neural Networks, vol. 9, No. 1, IEEE, Jan. 1998.

Boon Chiang Ng et al. "Application of adaptive neural predictive control for an automotive air conditioning system", Applied Thermal Engineering, 73 (2014) 1242-1252, Elsevier, Aug. 2014.

K. Xu et al. "Application of neural networks in forecasting engine systems reliability", Applied Soft Computing 2 (2003) 255-268, Elsevier, Oct. 2002.

Alex Alexandridis et al. "An offset-free controller based on a non-extrapolating scheme for approximating the inverse process dynamics", Journal of Process Control 23 (2013) 968-979, Elsevier, Jun. 2013.

Boon Chiang Ng et al. "Dynamic modelling of an automotive variable speed air conditioning system using nonlinear autoregressive exogenous neural networks", Applied Thermal Engineering 73 (2014) 153-1267, Elsevier, Aug. 2014.

* cited by examiner

BALANCED HEAT TRANSFER MECHANISM AND CONTROL FOR AUTOMOTIVE VEHICLES COMMUNICATION SYSTEMS

BACKGROUND

Existing Network Access Devices (NADs) and Telematics Control Units (TCUs) are typically stacked one on top of the other. And a NAD may be soldered to a TCU. A control unit is typically placed away from the heat source. One or more antennas are typically placed on the roof of the vehicle.

Conventional vehicle telematics systems can typically only perform at 80° C. (176° F.) ambient (if optimized) due to the state of electronics. For example, the TCU may be built with automotive grade components (−40° C. to 125° C.) (−40° F. to 257° F.), and the NAD may be built with consumer (also referred to as industrial) grade components (−20° C. to 80° C.) (−4° F. to 176° F.).

More effective heat-dissipation from vehicle telematics systems would advance the state of the art.

BRIEF SUMMARY

In accordance with embodiments of the invention, an energy-moving device (EMD) transfers heat between a low-temperature-rated device (LTRD) and a high-temperature-rated device (HTRD), wherein the LTRD is thermally separated from the HTRD such that the LTRD is not stacked above the HTRD. A temperature-controlling device (TCD) actively transfers heat between the LTRD and the EMD. An air-moving device (AMD) generates an air stream for transferring heat from the EMD to ambient air. A controller receives temperature information about the ambient air, the LTRD, and the HTRD; determines when heat should be removed from the LTRD, when heat should be added to the LTRD, and when no heat needs to be transferred to or from the LTRD; and determines a first voltage for the TCD and a second voltage for the AMD based on the received temperature information. And a neural network updates the voltage values based on how effectively the voltage values have performed.

DETAILED DESCRIPTION

Figure 1:
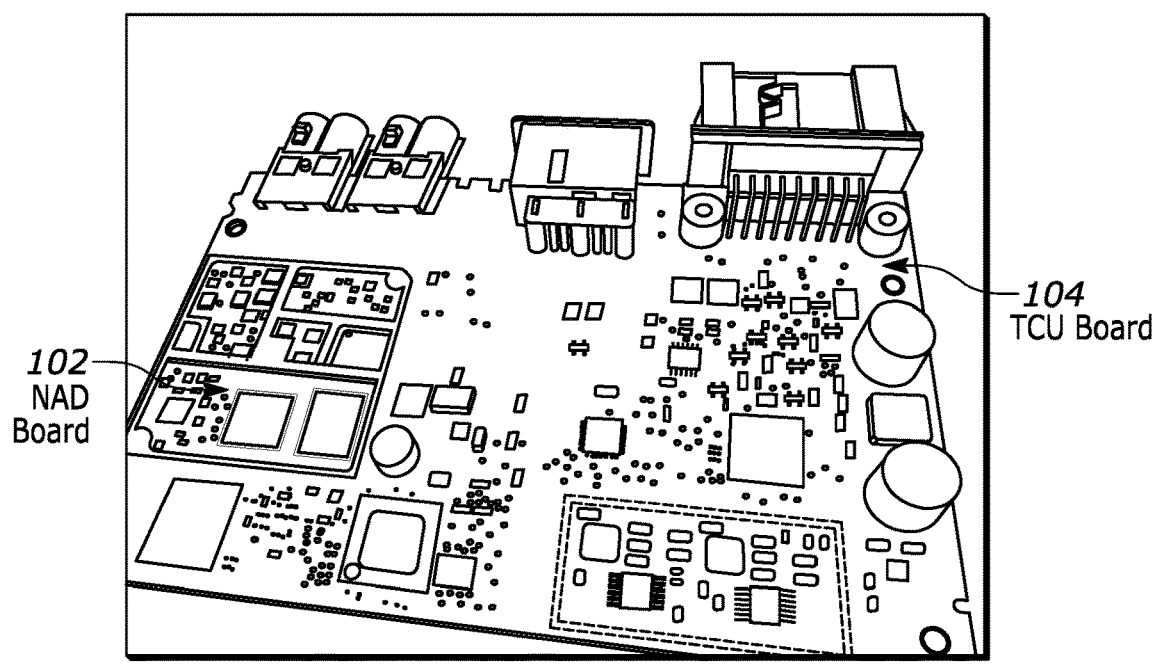
FIG. 1 depicts a network-access-device board stacked on top of an automotive telematics control board.

A conventional telematics system, such as the one depicted in FIG. 1, for a vehicle can typically operate continuously at 60° C. (140° F.) ambient air; with some component placement and heatsink optimization, such a telematics system can typically operate at 80° C. (176° F.).

Thermally separating the NAD from the TCU (i.e., "unstacking" them), enables operation in 90° C. (194° F.) or even 95° C. (203° F.) ambient air environments.

Consumer grade electronics on the NAD board will have limited functionality at component junction temperatures greater than 115° C. (239° F.). NAD-component temperatures, therefore, should be kept below 115° C. (239° F.).

In accordance with embodiments of the invention, a NAD board 102 is thermally separated from a TCU board 104 such that they are not stacked one above the other. Each board is heatsinked individually. And a NAD-cooling system is also implemented.

According to a thermal simulation with 85° C. (185° F.) ambient air, the NAD components had simulated temperatures of 95° C. (203° F.), which is below the 115° C. (239° F.) temperature below which NAD-components should be maintained for proper vehicle-telematics-system operation.

In accordance with embodiments of the invention, a balanced heat transfer mechanism is implemented between the two thermally separated systems.

Figure 2:
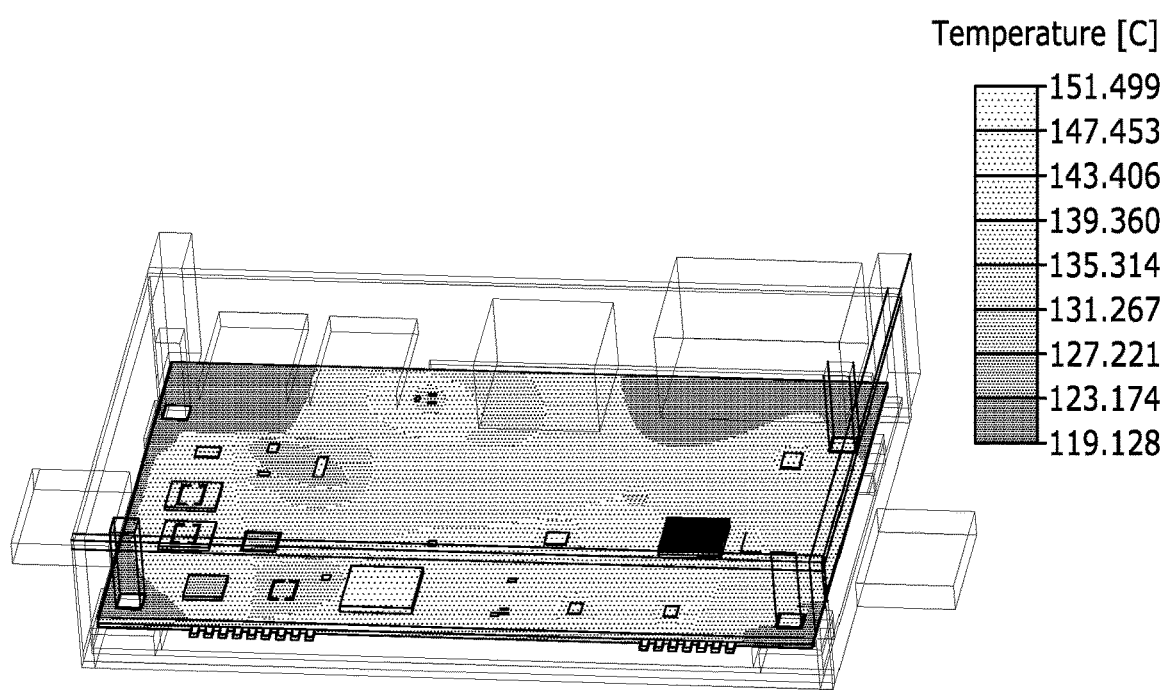
FIG. 2 depicts a thermal analysis of a NAD board stacked on top of a TCU board.

FIG. 2 depicts a thermal analysis of a NAD board stacked on top of a TCU board.

Figure 3:
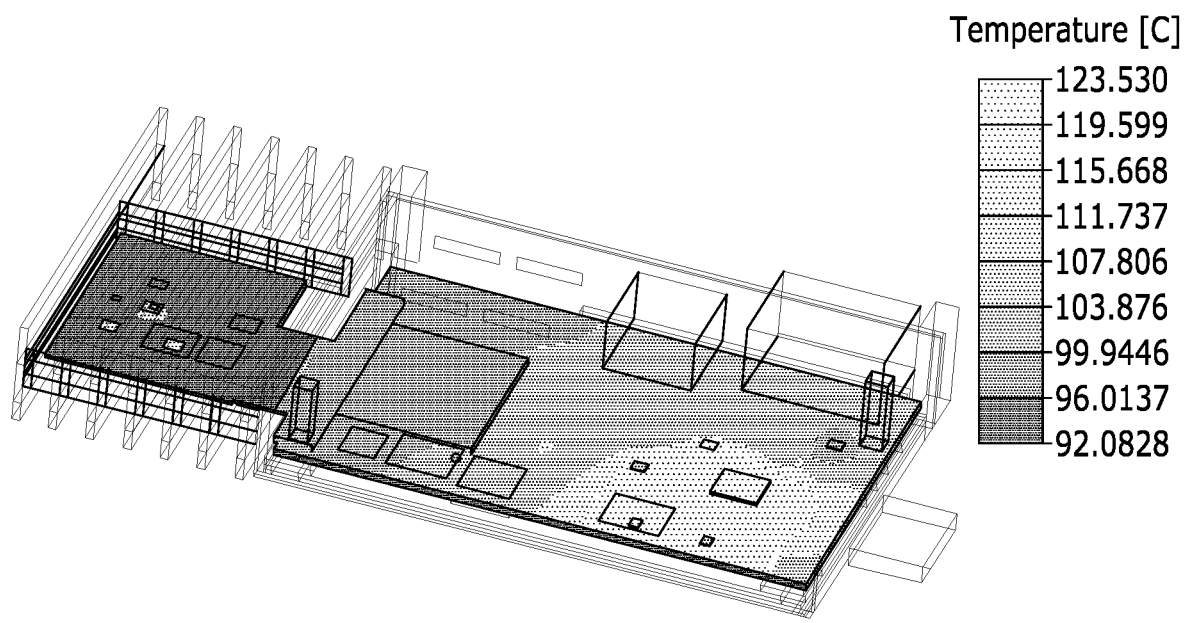
FIG. 3 depicts a thermal analysis of a NAD board that is thermally separated, by unstacking it, from a TCU board.

FIG. 3 depicts a thermal analysis of a NAD board that is thermally separated, by unstacking it, from a TCU board. As used herein, "thermally separated" means that the two PCB boards are unstacked, essentially physically separate from one another, and are connected only by a small interconnect. Unstacking the NAD board, and moving it outside of the TCU board, reduces NAD temperature by 30° C. (86° F.), and the TCU temperature also gets reduced. During testing, a telematics system laid out as depicted in FIG. 2 was not able to make an eCall (i.e., an emergency call) at 80° C. (176° F.). But by separating (i.e., unstacking) the NAD board from the TCU board, as depicted in FIG. 3, the telematics system was able to make an eCall at 80° C. (176° F.) for over an hour.

Figure 4:
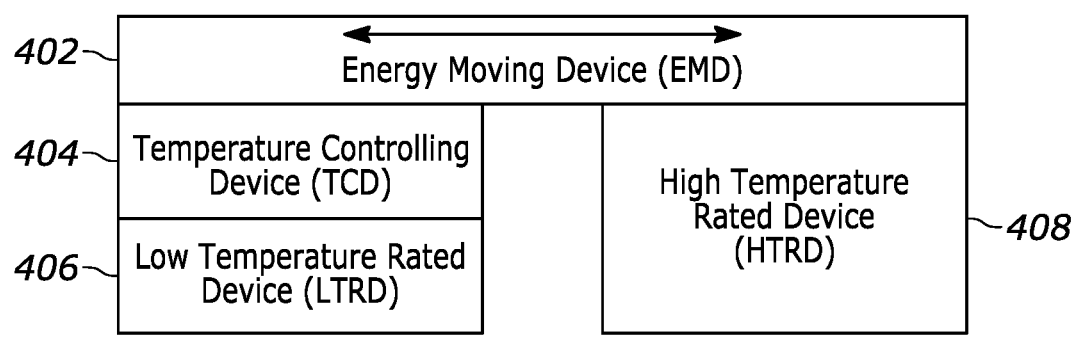
FIG. 4 depicts an Energy Moving Device (EMD) for transferring heat from a Low Temperature Rated Device (LTRD) and a Temperature Controlling Device (TCD) to a High Temperature Rated Device (HTRD).

FIG. 4 depicts an Energy Moving Device (EMD) 402 for transferring heat from a Low Temperature Rated Device (LTRD) 406 and a Temperature Controlling Device (TCD) 404 to a High Temperature Rated Device (HTRD) 408. The EMD may also transfer heat in the opposite direction from the HTRD to the TCD and the LTRD.

The EMD may be a heat pipe, a heat column, a heat spreader, or any other suitable device for transferring heat and may include a fan for moving air.

A fan is a powered machine used to create flow within a fluid, typically a gas such as air. There are three main types of fans used for moving air, axial, centrifugal (also called radial) and cross flow (also called tangential).

A heat pipe is a heat-transfer device that combines the principles of both thermal conductivity and phase transition to effectively transfer heat between two solid interfaces. At the hot interface of a heat pipe, a liquid in contact with a thermally conductive solid surface turns into a vapor by absorbing heat from that surface. The vapor then travels along the heat pipe to the cold interface and condenses back into a liquid—releasing the latent heat. The liquid then returns to the hot interface through either capillary action, centrifugal force, or gravity, and the cycle repeats. Due to the very high heat transfer coefficients for boiling and condensation, heat pipes are highly effective thermal conductors.

A heat column is a hollow cylinder with a wick structure bonded to the interior surface. Heat columns are seen in light-emitting-diode and personal-computer central-processing-unit thermal modules, and other industrial thermal management applications. Heat columns may be constructed from a copper pipe with a sintered copper powder wick.

A heat spreader transfers energy as heat from a hotter source to a colder heat sink or heat exchanger. There are two thermodynamic types, passive and active. The most common sort of passive heat spreader is a plate or block of material having high thermal conductivity, such as copper, aluminum, or diamond.

The TCD 404 may be a thermoelectric cooler, a phase-change material, or any other suitable device.

A thermoelectric cooler uses the Peltier effect to create a heat flux at the junction of two different types of materials. A Peltier cooler, heater, or thermoelectric heat pump is a solid-state active heat pump, which transfers heat from one side of the device to the other, with consumption of electrical energy, depending on the direction of the current. Such an instrument may also be called a Peltier device, Peltier heat pump, solid state refrigerator, or thermoelectric cooler (TEC). It can also be used as a temperature controller that either heats or cools. When operated as a heat pump, a voltage is applied across the device, and as a result, a difference in temperature will build up between the two sides.

A phase change material (PCM) is a substance which releases/absorbs sufficient energy at phase transition to provide useful heat/cooling. By melting and solidifying at the phase change temperature (PCT), a PCM is capable of storing and releasing large amounts of energy compared to sensible heat storage. Ice, for example, requires 333.55 J/g to melt, but then water will rise one degree further with the addition of just 4.18 J/g. Other example PCMs include: sodium sulfate, aluminum, copper, gold, iron, lead, lithium, silver, and titanium.

The HTRD 408 may be any PCB that is high-temperature rated. A high-temperature-rated circuit board is typically defined as one with a Tg (glass transition temperature) greater than 170° C. (338° F.).

When the LTRD 406 needs to be cooled down, the power of the Temperature Controlling Device (TCD) 404 is adjusted, and the EMD 402 is used, to move excess heat from the LTRD 406 to the HTRD 408. This continues, namely, lowering the temperature of the LTRD, until the LTRD reaches a temperature that is lower than a maximum operating temperature for components of the LTRD, such as the 115° C. (239° F.) limit, mentioned above, over which consumer grade electronics on the NAD board will have limited functionality.

Normal consumer grade components are rated to 80° C. Automotive grade components are rated to 120° C. and higher. Some consumer-graded components, in emergency situations, could be allowed to work up to 110° C.-115° C., only in emergency situations. They will work until they burn/fail. Normally, at 115° C., a NAD will not function unless it has to make an emergency call, which it will do, even if the equipment melts.

When the LTRD 406 needs to be warmed up, the LTRD is heated by moving energy from the HTRD 408 to the LTRD using the EMD 402 to increase the LTRD temperature. This continues until the temperature of LTRD has reached a temperature that is higher than a minimum operating temperature for components of the LTRD, such as the (−20° C.) (−4° F.) limit, mentioned above, under which consumer grade electronics on the NAD board would have limited functionality. Normal consumer rated devices minimum temperature is −20° C. In the case of automotive devices (similar to industrial devices), the rating is −40° C.

In accordance with embodiments of the invention, a pulse-width-modulated (PWM) control is developed to optimize air flow and the cooling/heating mechanism in order to optimize the rate at which heat is being transferred between the LTRD and the HTRD.

Figure 5:
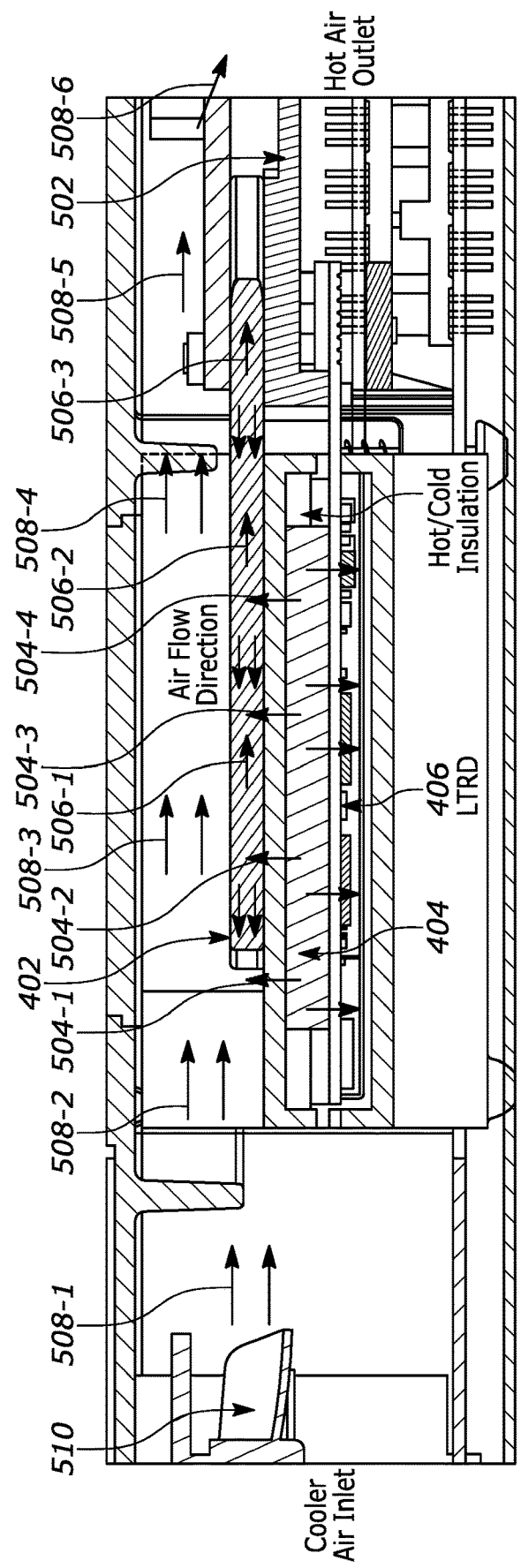
FIG. 5 depicts heat transfer between various components in accordance with embodiments of the invention.

As shown in FIG. 5, heat is moving from warmer (left-hand) side to the cooler (right-hand) side. Heat moves upward within the TCD and then into thermal contact with the EMD, as indicated by arrows 504-1 through 504-4, and the heat-distributing housing 502, as depicted by arrows 506-1 through 506-3. The air flow from the air moving device then dissipates the heat from the EMD and the heat-distributing housing. Balanced heat transfer direction depends on the state of the electronics, that is, whether heat needs to be removed from or added to the LTRD 406. Heat can move from left to right in FIG. 5 (in case of removing heat from the LTRD), or from right to left when heat needs to be added (temperature increased) to the LTRD.

A temperature reading module may be used to determine whether, and in which direction, heat should be transferred between the LTRD and the HTRD. The temperature reading module may be electrically connected, in a manner well known in the art, to temperature sensors (or arrays of temperature sensors) I, II, and III, temperature measurements from which are referred to in FIGS. 6, 8, and 9.

Figure 6:
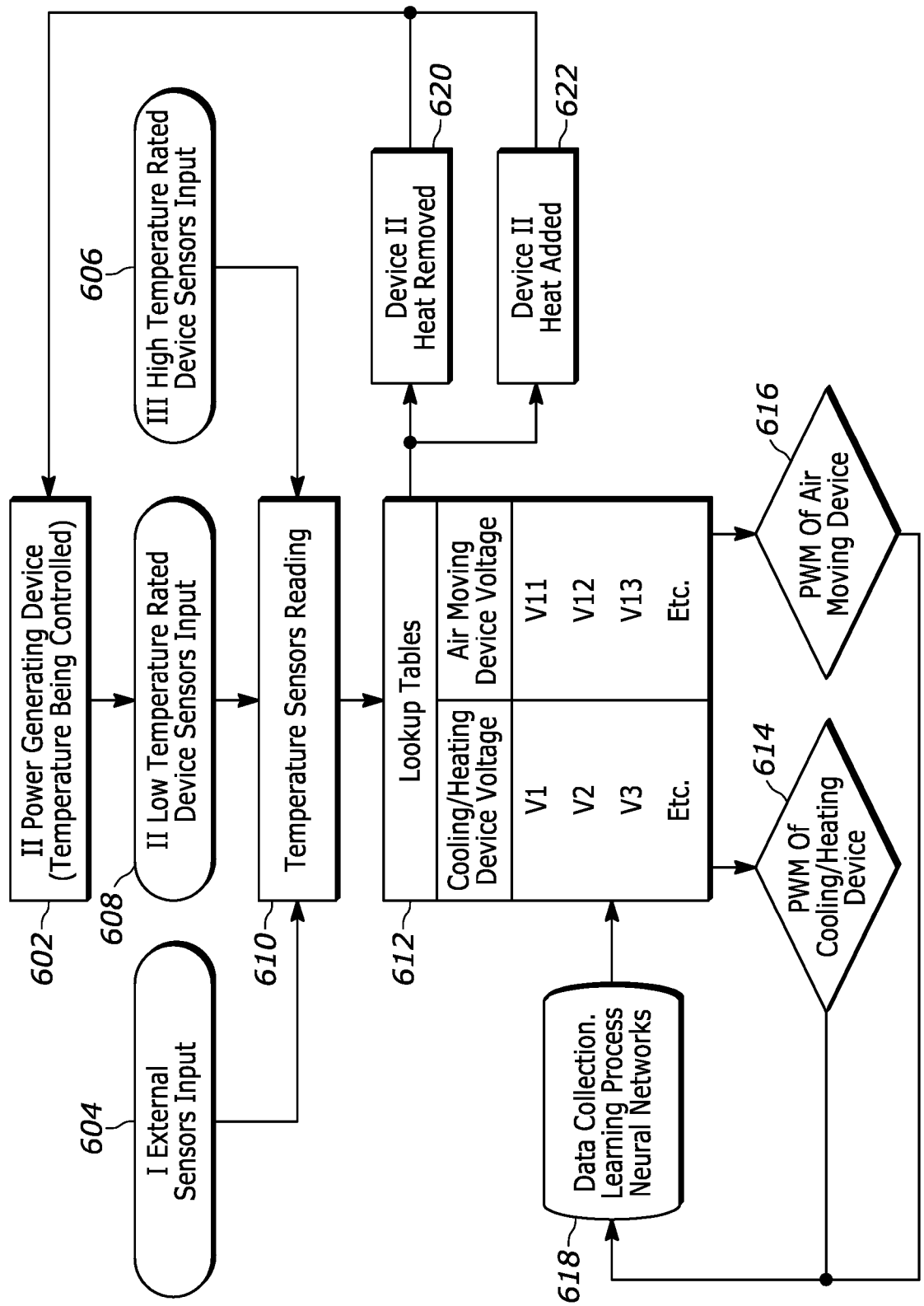
FIG. 6 is a flow diagram depicting balanced-heat-transfer, heating/cooling-device, and air-moving-device optimization in accordance with embodiments of the invention.

FIG. 6 is a flow diagram depicting balanced-heat-transfer, heating/cooling-device, and air-moving-device optimization in accordance with embodiments of the invention.

Device II 602, which is referred to as a Power Generating Device in FIG. 6, may be the LTRD 406 of FIGS. 4 and 5. External (i.e., ambient air) temperature Sensor Input (Sensor I) 604, LTRD sensor input (Sensor II) 608, and HTRD sensor input (Sensor III) 606 provide temperature sensor inputs to the temperature sensors reading module 610, described above.

The Lookup Tables 612 are used to pick an appropriate voltage for the Cooling/Heating device, which may be the TCD 404 of FIGS. 4 and 5, and for the Air Moving Device 510 of FIG. 5.

In order to reach a desired operating temperature of the LTRD, Pulse Width Modulation (PWM) of Cooling/Heating device 614 (the Cooling/Heating device is also referred to as the TCD 404) and PWM of the air-moving device 616 are set based on values selected from the lookup tables 612, and those values are then input into Data Collection, learning process Neural Networks 618. A neural network, as used herein, refers to an artificial neural network, composed of artificial neurons or nodes for solving artificial intelligence (AI) problems. As is known in the art, the connections of the neuron are modeled as weights. A positive weight reflects an excitatory connection, while negative values mean inhibitory connections. Inputs are modified by a weight and summed. This activity is referred to as a linear combination.

An activation function may control the amplitude of the output. For example, an acceptable range of output may be between 0 and 1, or it could be between −1 and 1. Artificial networks of this type may be used for adaptive control and applications where they can be trained via a dataset. Self-learning resulting from experience can occur within such networks. Depending on the temperatures sensed by temperature sensors 604, 606, and 608, heat may be removed from the LTRD, as depicted at 620, or heat may be added to the LTRD, as depicted at 622.

Figure 7:
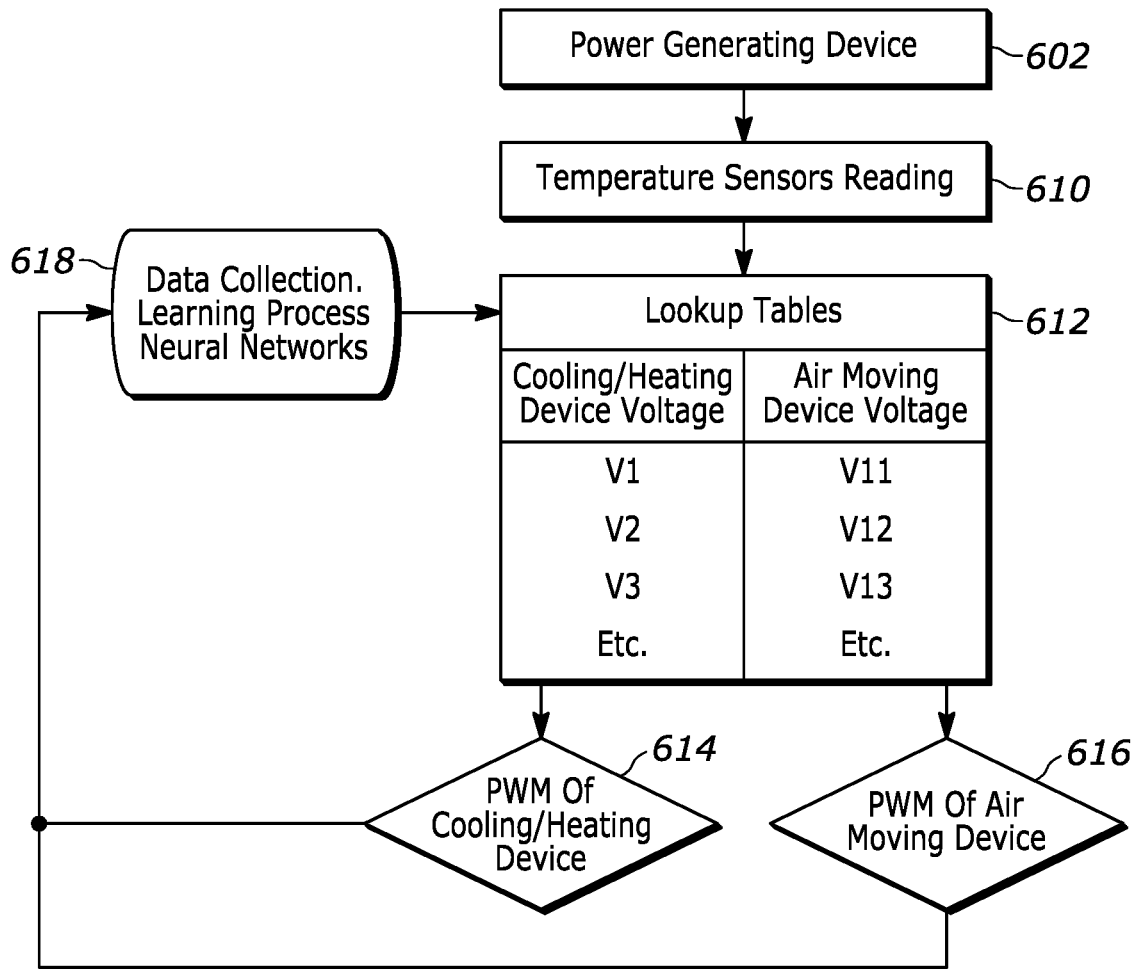
FIG. 7 is a flow diagram depicting balanced-heat-transfer, heating/cooling-device, and air-moving-device optimization in accordance with embodiments of the invention.

FIG. 7 is a flow diagram depicting balanced-heat-transfer, heating/cooling-device, and air-moving-device optimization in accordance with embodiments of the invention. FIG. 7 is similar to FIG. 6 and shows how the Cooling/Heating device, also referred to as the TCD 404, and the Air Moving device 510 are being PWM (pulse width modulation) optimized based on temperature sensor readings for the power generating device 602 for which operating temperature is being controlled.

Figure 8:
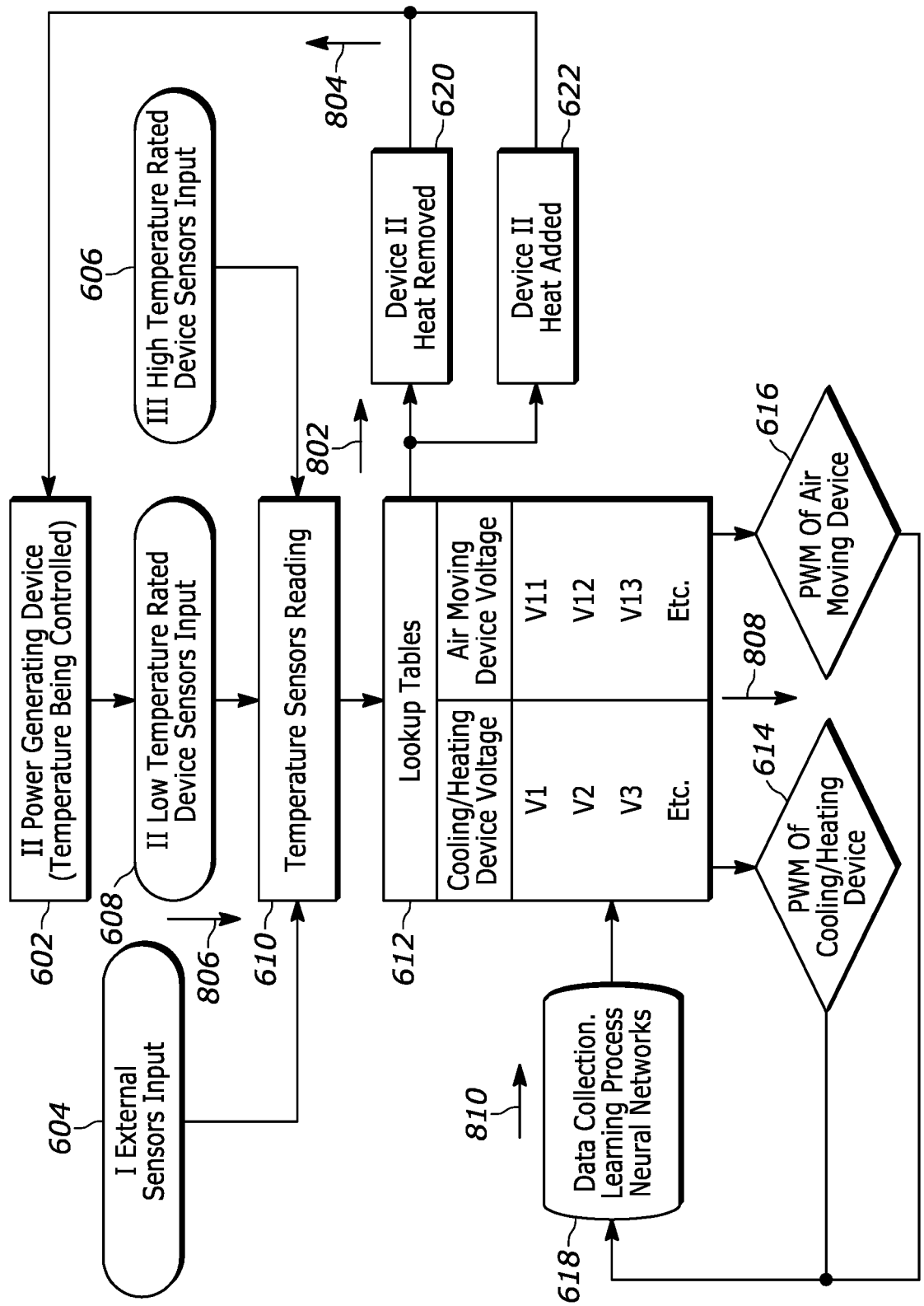
FIG. 8 is a flow diagram depicting balanced-heat-transfer, heating/cooling-device, and air-moving-device optimization in accordance with embodiments of the invention in a situation in which the LTRD needs heat removed.

FIG. 8 is a flow diagram depicting balanced-heat-transfer, heating/cooling-device, and air-moving-device optimization in accordance with embodiments of the invention in a situation in which the LTRD needs heat removed. The arrows 802 and 804 in FIG. 8 along the path from the lookup tables to Device II Heat removed 620 and then to II Power Generating Device (temperature being controlled) 602 depict cooling/heating device voltages and air moving-device voltages, which, when applied to the TCD 404 and the air-moving device 510, respectively, result in an optimized amount of heat being removed from the LTRD 406.

When the LTRD, which could be a Network Access Device (NAD) (communication device) is too hot to operate (based on sensors input), the active-cooling devices (Peltier and fan) are activated, which creates a cold side and a hot side on the Peltier device, also referred to herein as the TCD 404. As is known in the art, the polarity of the voltage applied to the Peltier device determines which side of the device will be the hot side and which side will be the cold side. So, by applying an opposite polarity to the device, the hot side and the cold side will be reversed.

In this way, the hot-side heat may be removed from the NAD area to prevent system saturation. This may be achieved with heat pipes, for example, and a fan moving the heat away from the NAD. The sensed temperature data being used as an input to the lookup tables 612 and being mapped to PWM values is depicted by arrows 806 and 808, respectively.

Operation in such a mode may continue until the NAD temperature drops to an operational level (e.g., below 85° C. (185° F.)).

The active cooling Peltier and the fan/air-moving device 510 may be PWM optimized based on power generated by the NAD (which depends on scenarios of the NAD: uplink, downlink speed, RF performance, which can be taken into account). As previously mentioned, one or more temperature sensors measure the temperature of the NAD, and these temperature measurements are used for PWM optimization.

PWM-optimization and temperature data monitoring proceed and determine whether any data shifts occur, as depicted by arrow 810 from data collection, learning process neural networks 618 toward the lookup tables 612. In this way, the system learns how to react quickly based on historical data.

In normal working temperature conditions, active cooling is inactive in a sleep mode, but the system monitors any changes in temperature conditions.

In another example, when the NAD (communication device) is too hot to operate (based on sensors input), for example, NAD temperature reading 105° C. (221° F.), the active cooling devices (Peltier and fan) are activated (this creates a cold side and a hot side). In this example, the Peltier device is activated with 4.1V and the fan is activated with 5V. The NAD temperature still keeps increasing to 105.5° C. (221.9° F.), but the rate at which the temperature increases slows down. The PWM Peltier voltage is then adjusted to 4.5V, and the Fan voltage to 7V. The NAD temperature starts dropping to 100° C. (212° F.), after reaching 100° C. (212° F.) it turns back and starts increasing. PWM Peltier is then adjusted to 4.3V and the fan is adjusted to 8V. The NAD temperature stops increasing and stabilizes at 101° C. (213.8° F.).

In this way, the system is PWM optimized and data monitoring is in progress looking for any data shifts. Data gets written to the neural network learning database, and the system is learning how to react quickly based on historical data. Stated differently, new temperature data and PWM reaction causes the system to react, and any corrections are made based on how fast the system reacts and how stable the reaction correction is.

Figure 9:
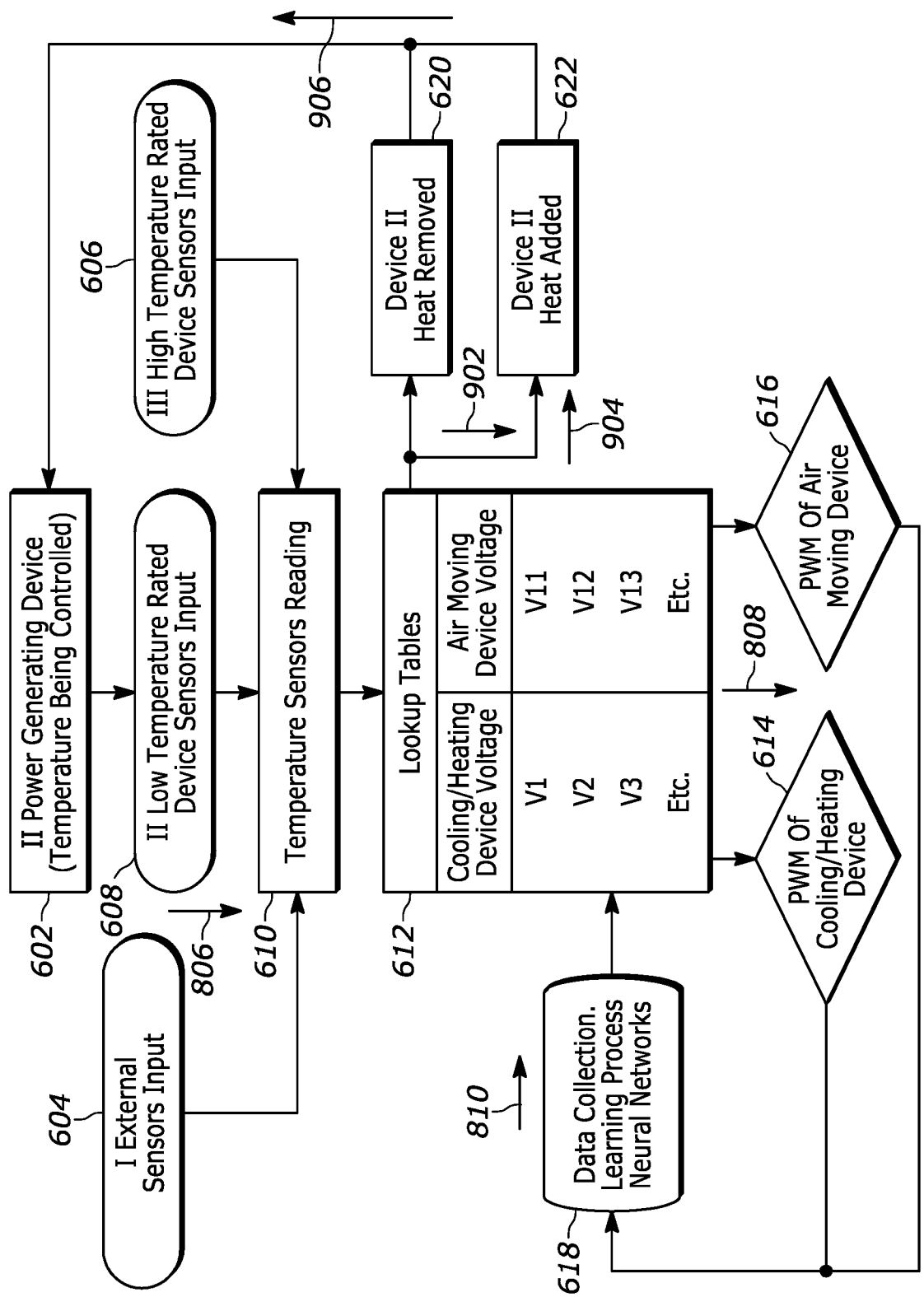
FIG. 9 is a flow diagram depicting balanced-heat-transfer, heating/cooling-device, and air-moving-device optimization in accordance with embodiments of the invention in a situation in which the LTRD needs heat added.

FIG. 9 is a flow diagram depicting balanced-heat-transfer, heating/cooling-device, and air-moving-device optimization in accordance with embodiments of the invention in a situation in which the LTRD needs heat added. In this example, the NAD (communication device) is too cold to operate (based on sensors input). The active cooling devices (Peltier and fan) are activated, as depicted by arrow 902, 904, and 906. This creates a cold side and a hot side, which are reversed relative to the hot side and the cold side when the LTRD needs heat removed. When the NAD is in sleep mode, heat is transferred from the hotter TCU with heat pipes, which is a pure passive solution. Instant temperature increase (if passive solution is not enough) by reversing the polarity (on the Peltier) so that heat is added to the NAD. The NAD temperature then increases to an operational level.

Active cooling Peltier and fan are PWM optimized based on power generated by the NAD (which depends on scenarios of the NAD: uplink, downlink speed, RF performance, as discussed in more detail above). The system is PWM optimized and data monitoring progresses looking for any data shifts, as is discussed in more detail above. The system is learning how to react quickly based on historical data. In normal working temperature conditions, active cooling is inactive in a sleep mode, but the system monitors any changes in conditions.

Figure 10:
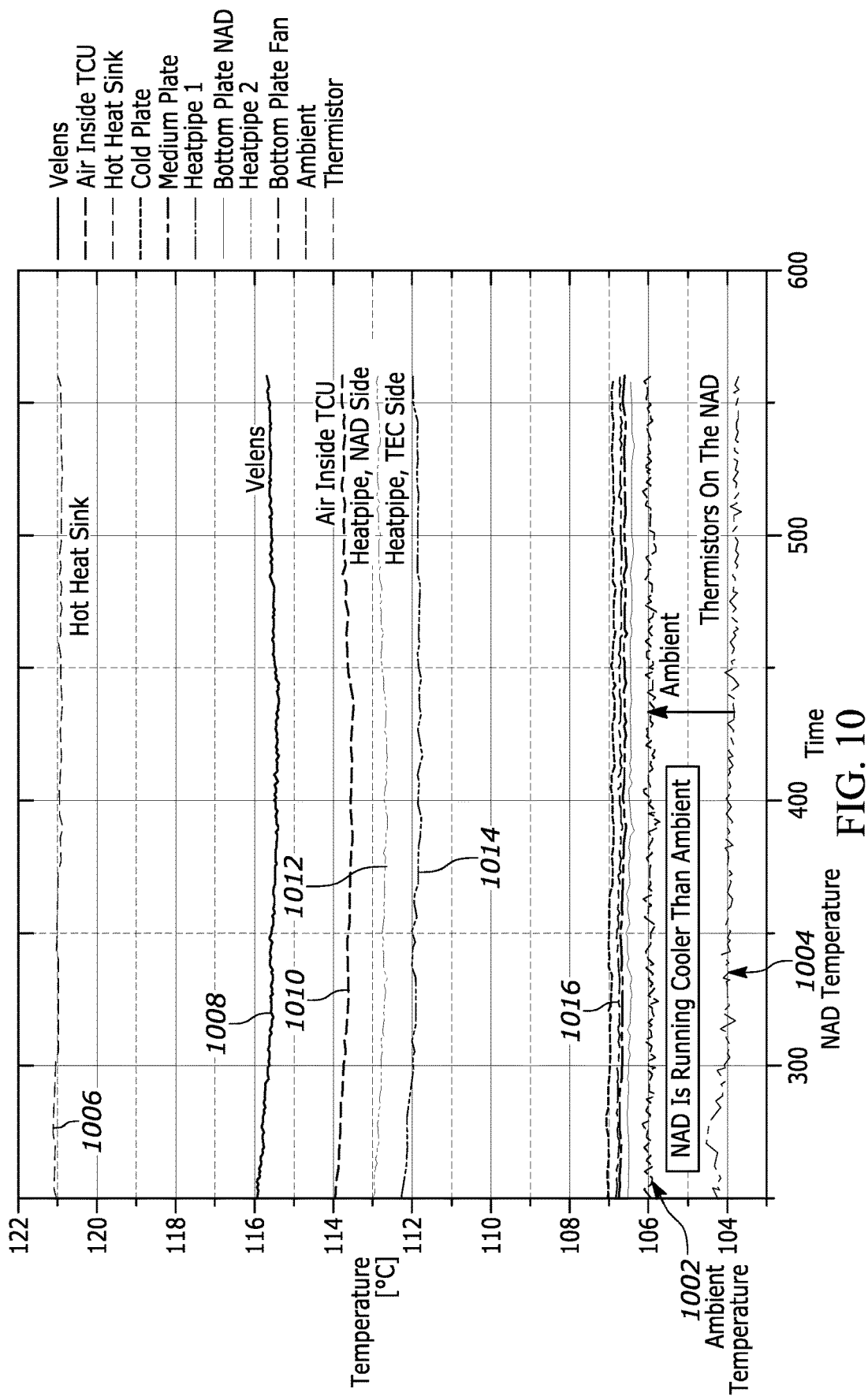
FIG. 10 depicts temperatures recorded from an embodiment of the invention while heat needed to be removed from the NAD because the ambient temperature was approximately 106° C. (222.8° F.).

FIG. 10 depicts temperatures recorded from an embodiment of the invention while heat needed to be removed from the NAD because the ambient temperature 1002 was approximately 106° C. (222.8° F.). As shown at 1006, the temperature at the heat sink on the hot side of the TCD is approximately 121° C. (249.8° F.). The temperature 1008 at the Valens is approximately 116° C. (240.8° F.). The temperature 1010 of the air inside the TCU is approximately 114° C. (237.2° F.). The temperature 1012 at the NAD side of the heatpipe is approximately 113° C. (235.4° F.). The temperature 1014 at the TEC side of the heatpipe is approximately 112° C. (233.6° F.). The temperatures 1016 at the cold plate, the bottom plate fan, the heatpipe 2, bottom and the plate NAD are all approximately 107° C. (224.6° F.). The ambient air temperature 1002 is approximately 106° C. (222.8° F.), as mentioned above. And the temperature 1004, as measured by thermistors on the NAD, is approximately 104° C. (219.2° F.), which is approximately 2° C. (3.6° F.) below the ambient air temperature.

The separated design (i.e., NAD and TCU thermally separated from one another) coupled with PWM optimization and the balanced-heat-transfer mechanism allow an automotive-telematics system to operate continuously at 90° C. (194° F.) and even higher ambient air environments.

Additionally (in negative temp, below −20° C. (−4° F.)) the balanced-heat system allows consumer grade electronics (NAD) to remain operational at a temperature above the NAD's lower temperature limit, despite ambient temperatures being below the NAD's lower temperature limit.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of applicant's general inventive concept.

The invention claimed is:

1. An apparatus comprising:
   a high-temperature-rated device (HTRD) comprising an automotive telematics control unit;
   a low-temperature-rated device (LTRD) comprising a network access device, the LTRD being thermally separated from the HTRD such that the LTRD is not stacked above the HTRD;
   an energy-moving device (EMD) configured to transfer heat between the LTRD and the HTRD;
   a temperature-controlling device (TCD) configured to actively transfer heat between the LTRD and the EMD;
   an air-moving device (AMD) comprising a fan that is configured to generate an air stream for transferring heat from the EMD to ambient air;
   a controller that receives temperature information about the ambient air, the LTRD, and the HTRD and determines when heat should be removed from the LTRD, when heat should be added to the LTRD, and when no heat needs to be transferred to or from the LTRD, wherein the controller determines a first voltage for the TCD and a second voltage for the AMD based on the received temperature information; and
   a neural network that learns how particular values for the first voltage and the second voltage should be updated based on how effectively those particular values have performed to bring the LTRD within its normal operating range of temperatures in the past.

2. The apparatus of claim 1, wherein the EMD is a heat pipe.

3. The apparatus of claim 1, wherein the EMD is a heat spreader.

4. The apparatus of claim 1, wherein the EMD is a phase-change material.

5. The apparatus of claim 1, wherein the TCD is a thermoelectric cooler.

6. The apparatus of claim 5, wherein a polarity of the voltage applied to the TCD in order to add heat to the LTRD is opposite of a polarity of the voltage applied to the TCD to remove heat from the LTRD.

7. A method comprising:
   using an energy-moving device (EMD) to transfer heat between a low-temperature-rated device (LTRD) and a high-temperature-rated device (HTRD), wherein the LTRD is thermally separated from the HTRD such that the LTRD is not stacked above the HTRD;
   using a temperature-controlling device (TCD) to actively transfer heat between the LTRD and the EMD;
   using an air-moving device (AMD), comprising a fan, to generate an air stream for transferring heat from the EMD to ambient air;
   using a controller to receive temperature information about the ambient air, the LTRD, and the HTRD; to determine when heat should be removed from the LTRD, when heat should be added to the LTRD, and when no heat needs to be transferred to or from the LTRD; and to determine a first voltage for the TCD and a second voltage for the AMD based on the received temperature information; and
   using a neural network to learn how particular values for the first voltage and the second voltage should be updated based on how effectively those particular values have performed to bring the LTRD within its normal operating range of temperatures in the past.

8. The method of claim 7, wherein the EMD is a heat pipe.

9. The method of claim 7, wherein the EMD is a heat spreader.

10. The method of claim 7, wherein the EMD is a phase-change material.

11. The method of claim 7, wherein the TCD is a thermoelectric cooler.

12. The method of claim 11, wherein a polarity of the voltage applied to the TCD in order to add heat to the LTRD is opposite of a polarity of the voltage applied to the TCD to remove heat from the LTRD.

* * * * *